US012757759B2

(12) United States Patent
Liao et al.

(10) Patent No.: US 12,757,759 B2
(45) Date of Patent: Oct. 6, 2026

(54) METHOD OF MANUFACTURING SEMICONDUCTOR PACKAGES

(71) Applicant: TAIWAN SEMICONDUCTOR MANUFACTURING COMPANY, LTD., Hsinchu (TW)

(72) Inventors: Li-Ling Liao, Hsinchu City (TW); Ming-Chih Yew, Hsinchu City (TW); Chia-Kuei Hsu, Hsinchu City (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 770 days.

(21) Appl. No.: 17/833,820

(22) Filed: Jun. 6, 2022

(65) Prior Publication Data

US 2023/0395520 A1 Dec. 7, 2023

(51) Int. Cl.

| | |
|---|---|
| ***H10W 70/60*** | (2026.01) |
| ***H10P 72/70*** | (2026.01) |
| ***H10W 70/05*** | (2026.01) |
| ***H10W 70/09*** | (2026.01) |
| ***H10W 70/65*** | (2026.01) |
| ***H10W 70/685*** | (2026.01) |
| ***H10W 74/01*** | (2026.01) |
| ***H10W 74/10*** | (2026.01) |
| *H10W 70/652* | (2026.01) |

(52) U.S. Cl.

CPC ........... *H10W 70/614* (2026.01); *H10P 72/74* (2026.01); *H10W 70/05* (2026.01); *H10W 70/09* (2026.01); *H10W 70/093* (2026.01); *H10W 70/611* (2026.01); *H10W 70/65* (2026.01); *H10W 70/685* (2026.01); *H10W 74/016* (2026.01); *H10W 74/117* (2026.01); *H10P 72/743* (2026.01); *H10W 70/6528* (2026.01)

(58) Field of Classification Search

None

See application file for complete search history.

(56) References Cited

U.S. PATENT DOCUMENTS

| | | | |
|---|---|---|---|
| 10,319,607 | B2 | 6/2019 | Wu et al. |
| 11,315,875 | B2 | 4/2022 | Yang et al. |
| 11,521,930 | B2 | 12/2022 | Huang et al. |

(Continued)

FOREIGN PATENT DOCUMENTS

| | | | |
|---|---|---|---|
| TW | 202042368 | A | 11/2020 |
| TW | 202125722 | A | 7/2021 |

(Continued)

*Primary Examiner* — Sarah K Salerno

(74) *Attorney, Agent, or Firm* — STUDEBAKER BRACKETT PLLC

(57) ABSTRACT

A package structure includes an interposer, a die, a conductive terminal and an interconnection structure that is disposed on a first side of the interposer. The die is electrically bonded to the interposer and disposed over the interconnection structure. The conductive terminal is connected to the interposer and the die via a conductive bump. In order to effectively avoid cold joint issues, round or rectangular polyimide structures are first disposed under the bumps to structurally support the bump and sufficiently increase bump height for improved electrical connection and long term reliability of the package structure.

20 Claims, 15 Drawing Sheets

(56) References Cited

U.S. PATENT DOCUMENTS

| | | | | |
|---|---|---|---|---|
| 2011/0027944 | A1* | 2/2011 | Liu | H10W 74/137 257/E21.575 |
| 2015/0279815 | A1* | 10/2015 | Do | H01L 23/49827 257/737 |
| 2017/0005035 | A1* | 1/2017 | Chen | H01L 24/19 |
| 2017/0188458 | A1* | 6/2017 | Hsieh | H05K 1/181 |
| 2019/0057946 | A1* | 2/2019 | Chuang | H10W 20/40 |
| 2019/0206683 | A1 | 7/2019 | Hunt et al. | |
| 2020/0135709 | A1 | 4/2020 | Lee et al. | |
| 2020/0176346 | A1 | 6/2020 | Wu et al. | |
| 2021/0082847 | A1 | 3/2021 | Hsu et al. | |
| 2021/0082850 | A1* | 3/2021 | Chang | H01L 23/3128 |
| 2021/0118782 | A1 | 4/2021 | Huang et al. | |
| 2021/0193542 | A1 | 6/2021 | Chang et al. | |
| 2021/0193605 | A1 | 6/2021 | Tseng et al. | |
| 2021/0296220 | A1 | 9/2021 | Hsu et al. | |
| 2021/0305226 | A1 | 9/2021 | Tsai et al. | |
| 2021/0327723 | A1 | 10/2021 | Lu et al. | |
| 2021/0391314 | A1 | 12/2021 | Jeng et al. | |
| 2021/0407962 | A1 | 12/2021 | Kim et al. | |
| 2022/0028825 | A1 | 1/2022 | Jeng et al. | |
| 2022/0051959 | A1 | 2/2022 | Lee et al. | |
| 2022/0068869 | A1 | 3/2022 | Lee et al. | |
| 2023/0197561 | A1* | 6/2023 | Ammon | H01L 23/4006 257/690 |
| 2023/0197591 | A1* | 6/2023 | Ke | H01L 23/3128 257/686 |
| 2023/0395492 | A1* | 12/2023 | Lai | H01L 23/3128 |

FOREIGN PATENT DOCUMENTS

| | | | |
|---|---|---|---|
| TW | 202131467 | A | 8/2021 |
| TW | 202139395 | A | 10/2021 |
| TW | 202203410 | A | 1/2022 |
| TW | 202209582 | A | 3/2022 |

* cited by examiner

METHOD OF MANUFACTURING SEMICONDUCTOR PACKAGES

BACKGROUND

The semiconductor industry has historically experienced rapid growth due to continuous improvements in the integration density of various electronic components such as transistors, diodes, resistors, capacitors, and the like. Improvements in integration density have resulted mainly from continuous reductions in minimum feature size, which allows ever smaller components to be integrated into a given area. These smaller electronic components, in turn, require smaller semiconductor packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), package on package (PoP) devices and the like.

Chip-on-Wafer (CoW) and Chip-On-Wafer-On-Substrate (CoWoS) packaging technologies have been recently developed to facilitate power-efficient and high-speed computing using smaller electronic components. The packaging technology trend of high performance computing (HPC) application involves heterogeneous integration using bump or fine pitch bump to perform high-speed electrical communication. However, various technological challenges remain to be addressed with such packaging technologies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
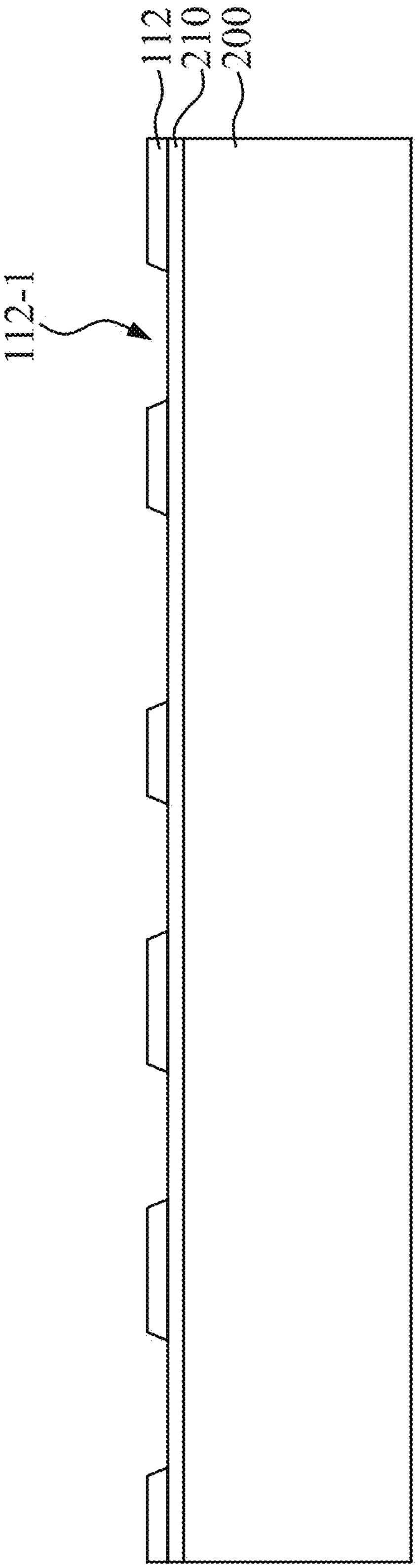
FIG. 1 shows, in cross-section, one of the stages of a sequential process for manufacturing a semiconductor device according to an embodiment of the present disclosure.

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but also depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term “made of” may mean either “comprising” or “consisting of.”

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description.

FIG. 1 through FIG. 10 illustrate cross sectional views of intermediate stages in the manufacturing of a semiconductor package structure according to various embodiments of the present disclosure. Some embodiments will be described in a specific context, namely, an integrated fan-out package (InFO) structure and manufacturing method thereof. The various concepts in this disclosure also apply, however, to other semiconductor packages or circuits. A device (e.g., a redistribution structure) applicable for a semiconductor package, a semiconductor package structure, and the method of forming the semiconductor package are provided herein in accordance with various embodiments, although other metallization structures are likewise useful. The intermediate stages of forming the semiconductor package are illustrated in accordance with some embodiments. Throughout the various views and illustrative embodiments, like reference numbers are used to designate like elements. Many, but not all contemplated, variations of the embodiments are discussed.

In some embodiments, the intermediate stages of forming a semiconductor package (e.g., the completed semiconductor package 100 shown in FIG. 10) are described as follows. With reference to FIG. 1, a wafer 200 is provided, and an adhesive layer 210 (if any) is disposed on the wafer 200, in some embodiments. In various embodiments, the wafer 200 includes, for example, silicon-based materials such as glass, ceramics, silicon oxide, aluminum oxide, and/or useful combinations of these and like materials. In various embodiments, at least one surface of the wafer 200 is planar in order to accommodate later attachment to additional semiconductor components, devices and/or packages. In some embodiments, the adhesive layer 210 is placed on the wafer 200 to assist in the adherence of overlying structures (e.g., the redistribution structure introduced later below). In such embodiments, the adhesive layer 210 includes an ultra-violet glue or other types of adhesives, such as pressure sensitive adhesives, radiation curable adhesives, light to heat conversion release coating (LTHC), epoxies, combinations of these, or the like.

In some embodiments, a completed redistribution structure (e.g., the completed redistribution structure 110 as described below and shown in FIG. 5) is formed on the wafer 200, or the adhesive layer 210 (when present). The formation of the redistribution structure includes the following steps in some embodiments. Turning to FIG. 1, the formation of a redistribution structure is commenced by initially depositing a first dielectric layer 112 on the wafer 200, or on the adhesive layer 210. In some embodiments, the first dielectric layer 112 is a polyimide or a polyimide derivative, although other suitable materials, such as polybenzoxazole (PBO), are used in other embodiments. In various embodiments, the dielectric layers 112 are formed of dielectric materials, such as oxides, silicon oxides, nitrides, carbides, carbon nitrides, combinations thereof, and/or multiple deposited layers thereof. In various embodiments, the first dielectric layer 112 is formed using, e.g., a spin-coating process, although any suitable method and thickness are also used. In various embodiments, the patterning method of the dielectric layer 112 includes laser drilling processes, lithography and etching processes, or the like. In some embodiments, the first dielectric layer 112 includes a pad opening 112-1. In some embodiments, the pad opening 112-1 is made through the first dielectric layer 112 by removing portions of the first dielectric layer 112 to expose at least a portion of the underlying wafer 200, or adhesive layer 210 (if any). In some embodiments, the pad opening 112-1 is formed using photolithographic mask and etching processes, although other suitable processes are used in other embodiments.

Figure 2:
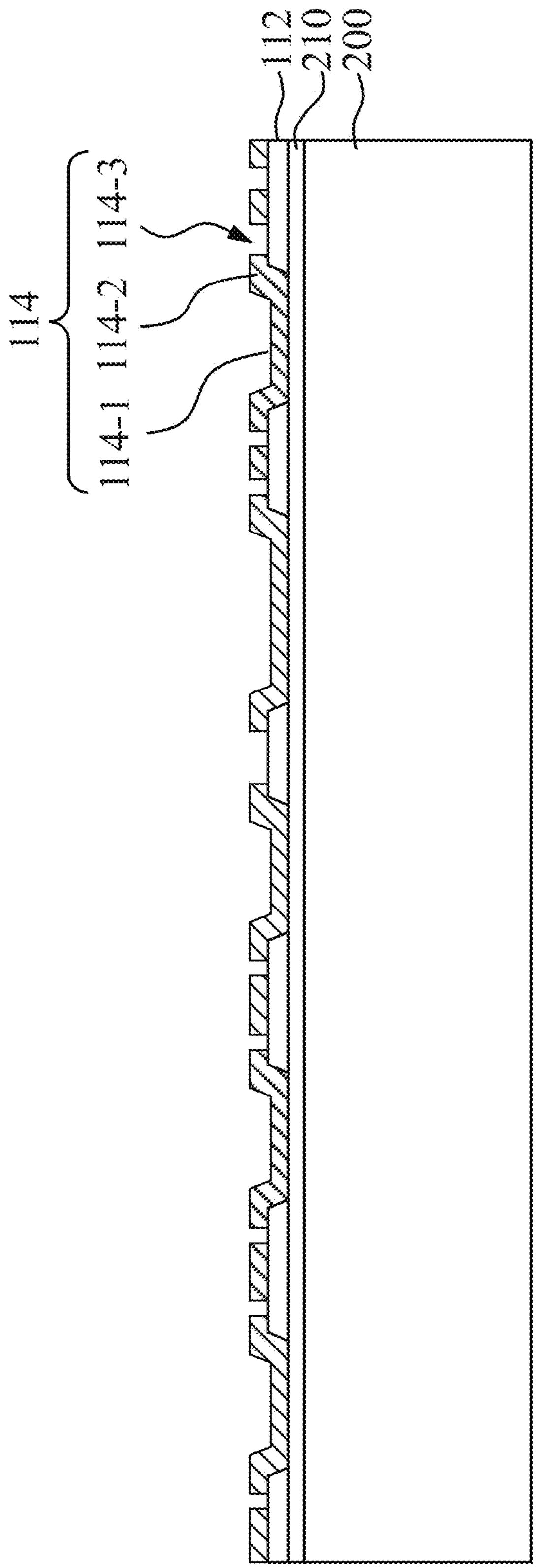
FIG. 2 shows, in cross-section, one of the stages of a sequential process for manufacturing a semiconductor device according to an embodiment of the present disclosure.

With reference to FIG. 2, a metal layer 114 is next formed on the first dielectric layer 112, in some embodiments. In various embodiments, the material of the metal layer 114 includes a metal such as aluminum, copper, tungsten and/or nickel, or alloys thereof. In some embodiments, the metal layer 114 is embedded in the pad opening 112-1 of the first dielectric layer 112. In some embodiments, the metal layer 114 extends into the pad opening 112-1 and includes a plurality of holes 114-3 extending through the metal layer 114. In some embodiments, the holes 114-3 are arranged in a mesh form (e.g. mesh holes). In some embodiments, the pad opening 112-1 has a rounded or a circular shape, and in such embodiments, the holes 114-3 are arranged as portions of a discontinuous circle located adjacent to the outer circumference (e.g. the peripheral portion 114-2) of the metal layer 114. In addition, in order to ensure that the peripheral portion 114-2 remains physically and electrically connected to the pad portion 114-1, a connecting portion of the peripheral portion 114-2 separates the holes 114-3 from each other.

In various embodiments, the metal layer 114 is one of the patterns of a redistribution circuit layer formed on the first dielectric layer 112, and the redistribution circuit layer includes more than one metal layer 114. In some embodiments, there are multiple alternating dielectric layers (such as first dielectric layer 112) and conductive layers (such as metal layer 114) that are deposited to form the completed redistribution circuit layer shown and described later below.

In various embodiments, the metal layer 114 is formed by initially forming a seed layer (not shown) through a suitable formation process such as chemical vapor deposition (CVD) or sputtering. In some embodiments, the seed layer includes Cu, Ti/Cu, TiW/Cu, Ti, CrCu, Ni, Pd or the like, and is deposited over the first dielectric layer 112 by, for example, sputtering. In some embodiments, a photoresist (not shown) is next formed to cover a part of the metal layer 114, and the photoresist is then patterned to expose those portions of the metal layer 114, where at least one pad portion 114-1 and a peripheral portion 114-2 are to be located. In some embodiments, the pad portion 114-1 is connected to the peripheral portion 114-2, and extends from an upper surface of the first dielectric layer 112 to a lower surface of the first dielectric layer 112. In some embodiments, the pad portion 114-1 and the peripheral portion 114-2 are integrally formed. Namely, the pad portion 114-1 is directly connected to the peripheral portion 114-2 without a borderline in between, in some embodiments.

In some embodiments, once the photoresist has been formed and patterned, a conductive material, such as copper (Cu), is formed on the seed layer through a deposition process, such as plating. However, it is readily understood that while the material and methods discussed are suitable to form the conductive material, these materials are merely exemplary. Other suitable materials, such as AlCu or Au, or any other suitable processes of formation, such as CVD or physical vapor deposition (PVD), are alternatively used to form the metal layer 114 in various embodiments. Once the conductive material has been formed, the patterned photoresist is removed through a suitable removal process, such as ashing, in some embodiments. In additional embodiments, after the removal of the patterned photoresist, those portions of the seed layer that were covered by the patterned photoresist are removed through, for example, a suitable etch process using the conductive material as a mask. However, the process described above is merely for illustration and the formation of the metal layer 114 is not limited thereto.

In some embodiments where the redistribution circuit layer is formed using the seed layer, a patterned photoresist, and a plating process, the holes 114-3 are formed by simply not depositing the photoresist in those areas where the holes 114-3 are desired. In this way, the holes 114-3 within the metal layer 114 are formed along with the rest of the redistribution circuit layer, and no additional processing is utilized.

In other embodiments, the metal layer 114 on the first dielectric layer 112 is formed as a solid material and the holes 114-3 are formed after the formation of the remainder of the metal layer 114. In such embodiments, photolithographic masking and one or more etching processes are utilized, whereby a photoresist is placed and patterned over the metal layer 114 after it has been formed, and one or more etching processes are utilized to remove those portions of metal layer 114 where the holes 114-3 are desired. Any other suitable processes are also used to form the holes 114-3 in various embodiments.

In various embodiments, the metal layer 114 is electrically connected to a conductive feature of a later-formed redistribution or interconnection structure and are thereby electrically connectable to further devices and components in electrical communication with the interconnection structure.

Figure 3:
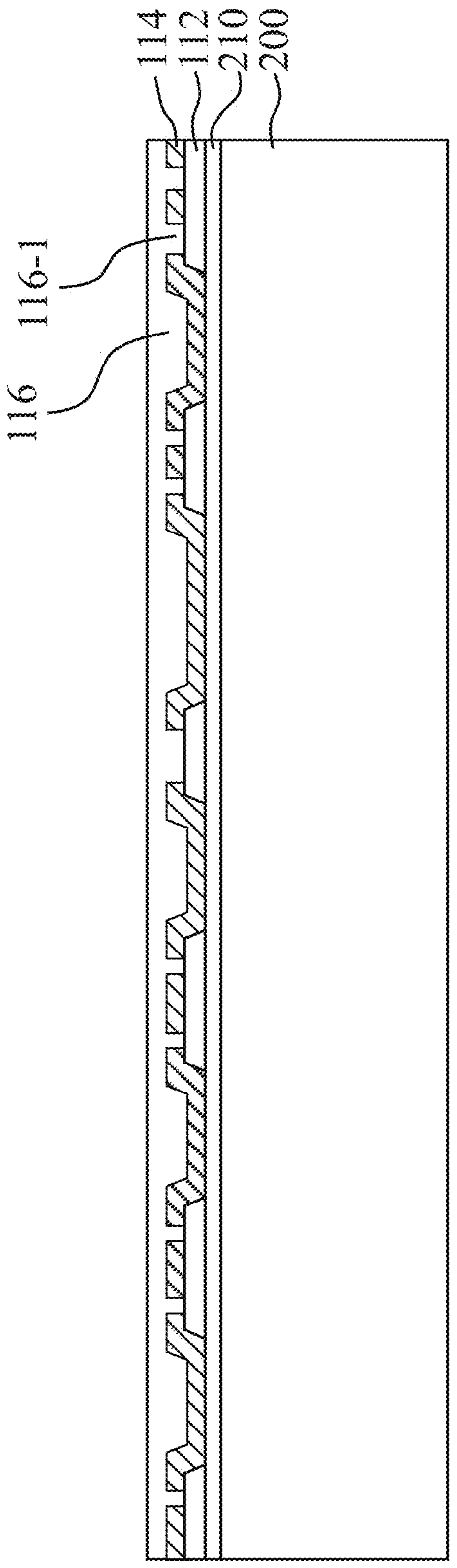
FIG. 3 shows, in cross-section, one of the stages of a sequential process for manufacturing a semiconductor device according to an embodiment of the present disclosure.

With reference to FIG. 3, in various embodiments a second dielectric layer 116 is formed on the metal layer 114. In some embodiments, the second dielectric layer 116 is formed of the same materials available for the formation of the first dielectric layer 112. In some embodiments, the second dielectric layer 116 fills the holes 114-3 to form a plurality of dielectric plugs 116-1 extending through the metal layer 114. In other words, the second dielectric layer 116 includes a plurality of extending portions of the dielectric plugs 116-1 that extend through the peripheral portion 114-2. In such embodiments, the holes 114-3 are filled with the dielectric material of the second dielectric layer 116. In some embodiments, the dielectric plugs 116-1 surround the pad opening 112-1 and extend through the peripheral portion 114-2. In various embodiments, the peripheral portion 114-2 is disposed on an upper surface of the first dielectric layer 112.

In some embodiments, the metal layer 114 is manufactured with the holes 114-3 through the peripheral portion 114-2 in order to reduce high sidewall peeling stresses, cracks and delamination that otherwise accumulate along the sidewalls of the metal layer 114 during thermal cycle tests, further processing, or operation. In some embodiments, there are multiple alternating dielectric layers (such as first dielectric layer 112 and second dielectric layer 116) and conductive layers (such as metal layer 114) that are deposited to form the completed redistribution structure shown and described later below. The number of alternating dielectric layers and conductive layers are not limited in this disclosure. In some embodiments, the arrangement of the metal layer 114 with the holes 114-3 is also applied in similar fashion to other layers of a completed redistribution structure.

Figure 4:
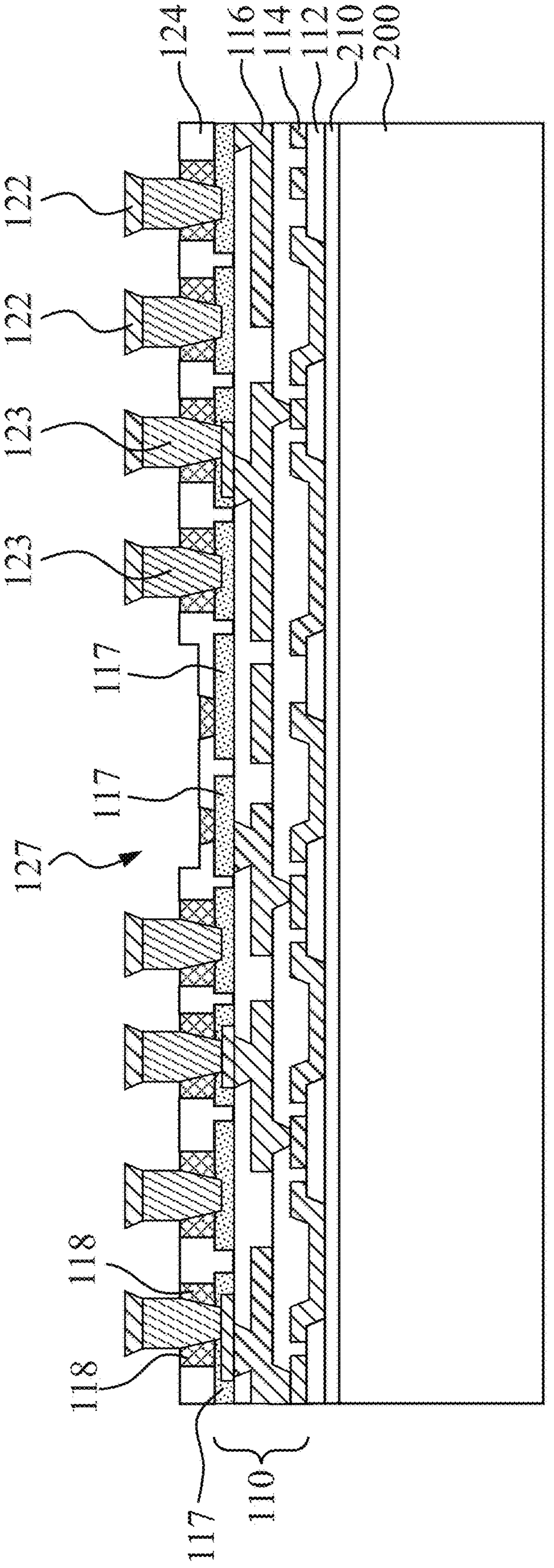
FIG. 4 shows, in cross-section, one of the stages of a sequential process for manufacturing a semiconductor device according to an embodiment of the present disclosure.

In some embodiments, the redistribution structure is formed by depositing conductive layers, patterning the conductive layers to form redistribution circuits, partially covering the redistribution circuits, and filling the gaps between the redistribution circuits with dielectric layers or the like. With reference now to FIG. 4, in various embodiments, after the second dielectric layer 116 is deposited over the first dielectric layer 112 and the metal layer 114, as well as any additional alternating metal layers and dielectric layers, a completed redistribution structure (RDL) 110 is formed.

In some embodiments, the RDL 110 is a metallization structure that electrically connects different devices in and/or on the wafer 200, so as to form a functional circuit. In some embodiments, the RDL 110 includes an inter-layer dielectric layer (ILD). In some embodiments, the RDL 110 includes one or more inter-metal dielectric layers (IMD). In various embodiments, the conductive features include multi-layers of conductive lines and conductive vias stacked alternately. In some embodiments, the conductive vias are disposed vertically between the conductive lines so as to electrically connect the conductive lines in different layers.

In various embodiments, a protective layer 117 is next formed over the RDL 110 and covers exposed portions of metal layer 114 for protection and durability before other semiconductor device components described herein are formed thereover. In some other embodiments, desired portions of the metal layer 114 are instead left exposed by the protective layer 117 for further electrical connection. In various embodiments, the protective layer 117 is a solder resist layer. In various embodiments, the material of the protective layer 117 includes an inorganic dielectric material, such as silicon oxide, silicon nitride, silicon oxynitride, combinations thereof, or like materials of similar properties. Additionally or alternatively, the protective layer 117 includes a polymer material such as photosensitive PBO, polyimide (PI), benzocyclobutene (BCB), a combination thereof, and the like.

In various embodiments, the protective layer 117 is formed on the RDL 110 by CVD, spin coating, or other suitable method. In some embodiments, the protective layer 117 is formed by depositing a layer of photosensitive material, exposing the layer with an optical pattern, and developing the exposed layer to form openings (not shown). In other embodiments, protective layer 117 is formed by depositing a non-photosensitive dielectric layer (e.g., silicon oxide, or silicon nitride, or the like), forming a patterned photoresist mask over the dielectric layer using photolithography techniques, and etching the dielectric layer to form openings (not shown) using a suitable etching process (e.g., dry etching) or other useful etching process. Other processes and materials are also available and used in various embodiments. Such openings expose underlying portions of conductive metal layers, traces or the like in various embodiments. In some embodiments, the height of the protective layer after deposition and planarization (if any) is between about 15 μm and about 45 μm.

In various embodiments, a pattern of one or more raised support structures 118 are next formed over the protective layer 117. In various embodiments, the raised support structure 118 provides support and additional elevation to later formed components of the semiconductor device package. In various embodiments, at least one of the raised support structures 118 are formed over an exposed internal metal layer 114 of the RDL 110, in order to allow for electrical communication therewith by additional package components. In some embodiments, the raised support structure 118 is referred to as a washer-shaped structure, where it is formed of a peripheral wall of various widths surrounding an empty or hollow central region. In some embodiments, the raised support structure 118 is round, such as circular or elliptical. In some embodiments, the raised support structure 118 is a regular polygon, such as a triangle, a square, a rectangle, a pentagon, a hexagon, an octagon and the like. The raised support structures 118 will be predominantly described herein as substantially circular or substantially square, but they are not limited to such configurations.

In some embodiments, the raised support structures 118 are formed in a partial region on the protective layer 117. In some embodiments, the raised support structures 118 are formed in in patterns across the entire protective layer 117. In some embodiments, the raised support structures 118 include two or more concentric wall layers. In some embodiments, at least one raised support structure 118 is formed from two or more separately formed raised structures 118 that are stacked. In some embodiments, the height of a raised support structure 118 is between about 15 μm and about 45 μm. In some embodiments, the width of the wall of the raised support structure is between 5 μm and 25 μm, such as between 10 μm and 15 μm.

In some embodiments, the raised support structures 118 are formed of a different material than the protective layer 117. In some embodiments, the raised support structures 118 are formed from an organic dielectric material. In some embodiments, the raised support structures 118 include a polyimide (such as a polymer formed from reacting a dianhydride and a diamine whose monomers include imides, or a positive or negative photoresist-like polyimide), a polyimide derivative (such as different carbonyl groups of dianhydrides), and other suitable materials (such as other thermoplastic polymers or thermosetting polymers) are used in other embodiments. In some embodiments, the raised support structures 118 are formed by deposition of a suitable material layer identified above, masking the layer according to a desired layout and removing portions of the layer by photolithography, etching or a similar process. Further features of the raised support structures 118 are described later below with respect to FIGS. 11-14.

In various embodiments, a conductive bump 123, such as a controlled collapse chip connection (C4) or other useful conductive structure, is formed within and over one or more of the raised support structures 118. In various embodiments, each conductive bump 123 provides electrical connection between an exposed metal layer 114 of the RDL 110 and an electrical connection or the like of later-added components of the completed semiconductor device, such as those described later herein. In some embodiments, the conductive bump 123 is formed of a conductive metal, such as tin, silver, nickel, copper, gold, aluminum, lead-free alloys (e.g., gold, tin, silver, aluminum, or copper alloys) or lead alloys (e.g., lead-tin alloys), combinations thereof, and similar materials with useful properties. In some embodiments, the conductive bump 123 is formed by a C4 formation process. In some embodiments, the conductive bumps 123 are formed by initially forming a layer of solder, such as by evaporation, electroplating, printing, solder transfer, ball placement, or the like. In some embodiments, once a layer of solder has been formed on the structure, a reflow is performed, in order to shape the material into the desired bump shapes.

In some embodiments, by forming the conductive bumps 123 within and above the walls of the raised support structures 118, the conductive bumps 123 are raised in elevation based on the height of the raised support structures 118, without using more costly bump material. In some embodiments, the raised support structures 118 form a unitary structure around a lower portion of the conductive bumps 123. In addition, in some embodiments, the conductive bumps 123 are supported circumferentially by the walls of the raised support structures 118, thereby enabling the conductive bumps 123 to be better able to withstand the stresses from further semiconductor manufacturing, testing, and operating processes. Such reduction or prevention of deformation by stresses prevents defects and increases the overall yield of a manufacturing process of completed semiconductor packages.

In various embodiments, a metal pillar 122 is next formed over one or more of the conductive bumps 123. In some embodiments, the material used to form the metal pillar 122 includes copper, nickel and/or other suitable metals. In some embodiments, a structure of the metal pillar 122 includes one or more copper, copper/nickel, or copper/nickel/copper metal layers.

In some embodiments, the metal pillar 122 is formed by first depositing a seed layer (not shown). In some embodiments, the seed layer is a metal seed layer, such as a copper seed layer. In some embodiments, the seed layer includes a first metal layer such as a titanium layer and a second metal layer such as a copper layer over the first metal layer. Thereafter, the metal pillar 122 is formed on the seed material layer by a plating (e.g. electroplating) process, for example. Afterwards, a mask layer is removed by a stripping process, and the seed material layer previously covered by the mask layer is removed by an etching process in some embodiments.

In other embodiments, the metal pillar 122 (such as a copper pillar) is formed by a sputtering, printing, electro plating, electroless plating, CVD, or the like. In various embodiments, the metal pillars 122 are solder-free and have substantially vertical sidewalls. In some embodiments, a metal cap layer (not shown) is formed on the top of the metal pillars 122. In various embodiments, the metal cap layer includes nickel, tin, tin-lead, gold, silver, palladium, indium, nickel-palladium-gold, nickel-gold, the like, or a combination thereof and are formed by a plating process.

In some embodiments, the width of the metal pillar 122 ranges from about 20 μm to about 60 μm, and in other embodiments, between about 25 μm to about 50 μm. In some embodiments, the height of the metal pillar 122 is in a range of about 20 μm to about 60 μm, and in other embodiments between about 30 μm and about 50 μm.

In some embodiments, a material such as a polymer is next applied between the metal pillars 122 and the redistribution structure 110 as an underfill 124. In certain embodiments, the underfill 124 is, for example, an epoxy. With the application of heat to the metal pillars 122 and/or the redistribution structure 110, the underfill 124 flows therebetween using capillary action in some embodiments. In embodiments where the underfill 124 is formed from a material such as a polymer epoxy, the underfill 124 is then typically cured, to harden the polymer. The cured underfill 124 surrounds the conductive bumps 123 and the raised support structures 118 and protects the electrical connection between the metal pillars 122 and the redistribution structure 110.

In various embodiments, a gap 127 is provided between certain metal pillars 122 to accommodate the formation or placement of additional components of a semiconductor device in accordance with design requirements. In some embodiments, the gap extends in the X and Y directions along a top surface of the wafer 200. In some embodiments, a top down view of the gap matches the pattern shown in FIGS. 16 and 17 below. In various embodiments, a plurality of gaps 127 are provided, in order to accommodate a plurality of additional components.

Optionally, a plurality of through vias (not shown) are provided on the wafer 200, and the through vias surround at least one gap 127 where additional semiconductor devices are to be connected or positioned. In some embodiments, the through vias are formed on and electrically connected to the redistribution structure 110 located on the wafer 200, but the disclosure is not limited thereto. In other embodiments, the through vias are pre-formed, and are placed on the wafer 200 at desired locations.

Figure 5:
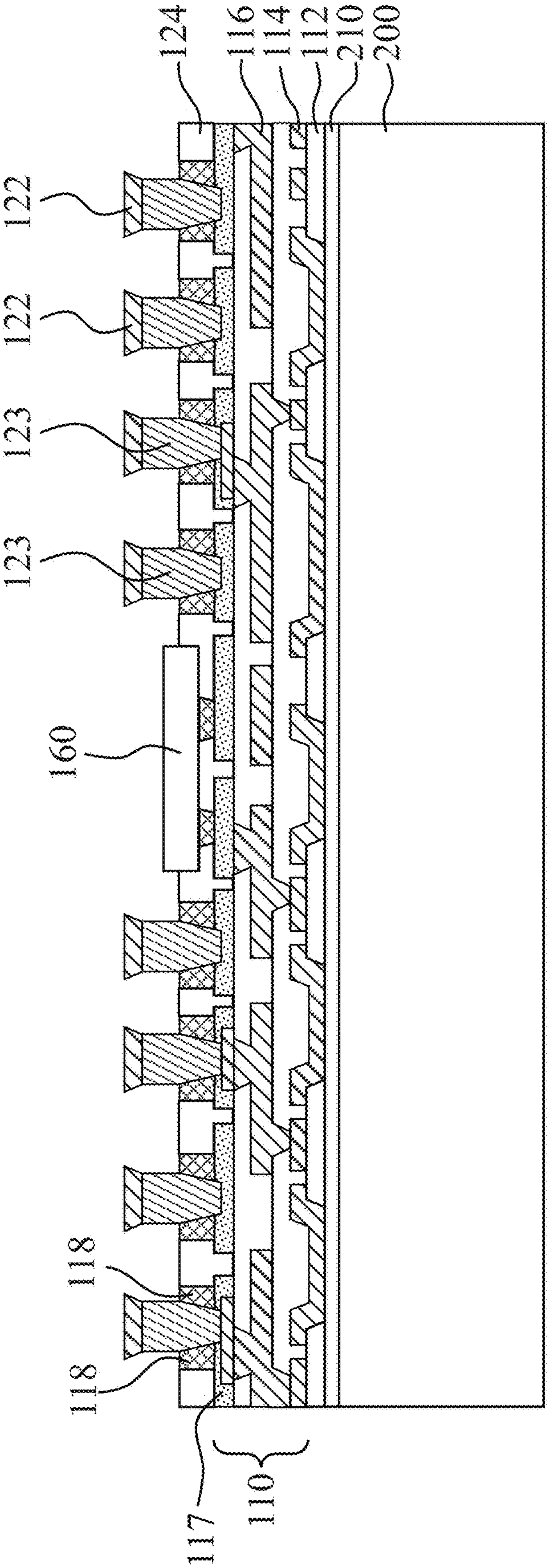
FIG. 5 shows, in cross-section, one of the stages of a sequential process for manufacturing a semiconductor device according to an embodiment of the present disclosure.

With reference to FIG. 5, in various embodiments, an integrated device 160 is next positioned within the gap 127. In various embodiments, the integrated device 160 is a pre-formed semiconductor device. In various embodiments, the integrated device 160 is a circuit substrate, such as a printed circuit board (PCB). In various embodiments, the integrated device 160 is an integrated circuit die. In some embodiments, the integrated device 160 is an active device, a passive device or a combination thereof. In some embodiments, the integrated device 160 is an integrated passive device (IPD). In some embodiments, the IPD includes a capacitor, a resistor, an inductor or the like, or combinations thereof. In some embodiments, the integrated device 160 is a Large Scale Integration (LSI) device or a bridge die. In various embodiments, the number of integrated devices is not limited but is adjusted according to design requirements. In various embodiments, the integrated device 160 is fabricated using wafer fabrication technologies, such as thin film and photolithography processing, and is mounted on pad portions 114-1 through, for example, flip-chip bonding, or similar processes.

Figure 6:
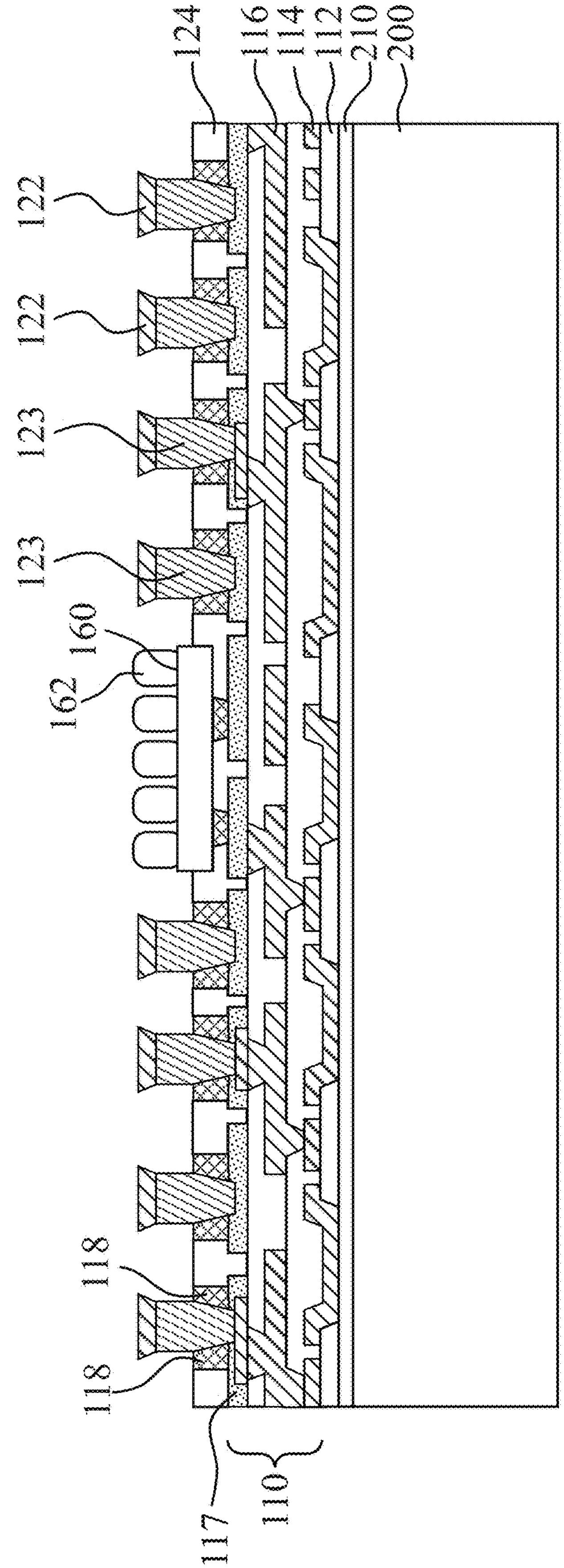
FIG. 6 shows, in cross-section, one of the stages of a sequential process for manufacturing a semiconductor device according to an embodiment of the present disclosure.

With reference now to FIG. 6, in various embodiments a plurality of micro-bumps 162 are next formed on the exposed top surface of the integrated device 160 to provide electrical communication between desired portions of the integrated device 160 and later-added components. In some embodiments, the micro-bumps 162 are solder balls formed by reflowing. In some embodiments, the micro-bumps 162 are solder bumps, gold bumps, copper bumps or other suitable metallic bumps used as die connectors. Other bonding techniques, such as direct metal-to-metal bonding, hybrid bonding, or the like, are also used in various embodiments.

Figure 7:
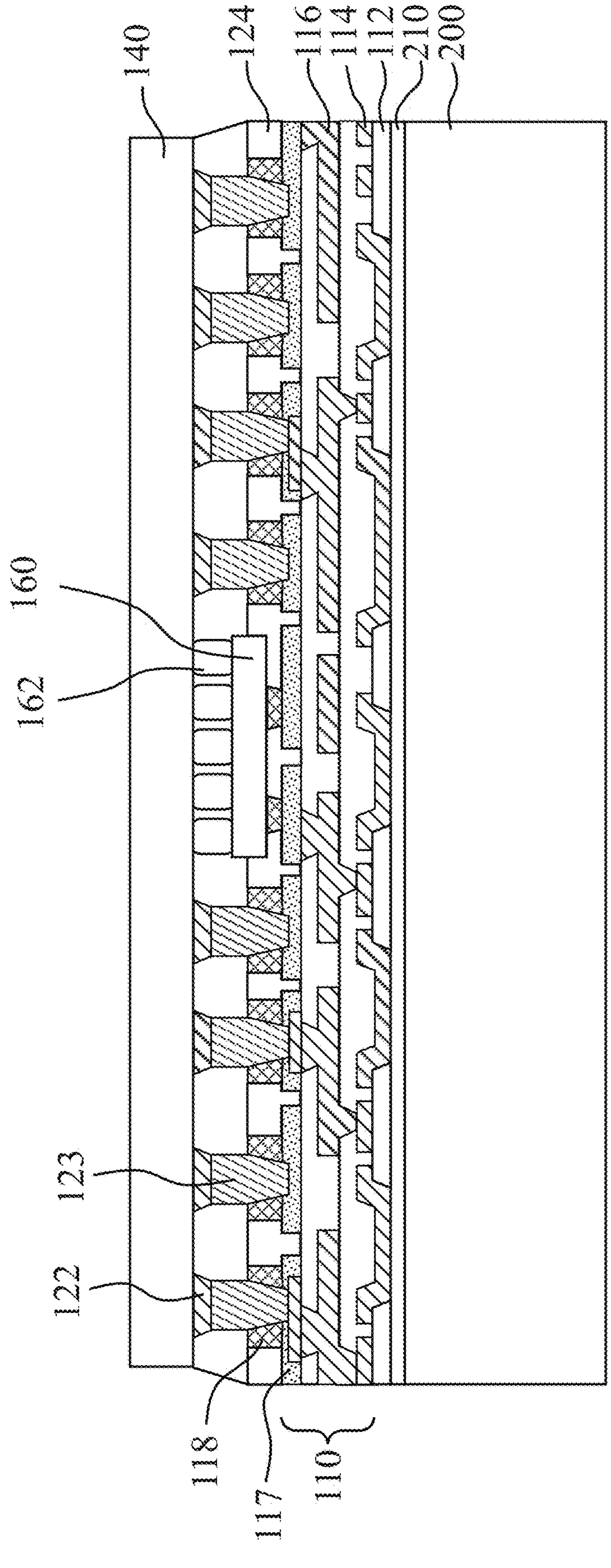
FIG. 7 shows, in cross-section, one of the stages of a sequential process for manufacturing a semiconductor device according to an embodiment of the present disclosure.

With reference now to FIG. 7, an interposer 140 is mounted over the metal pillars 122 and the integrated device 160 by a plurality of conductive joints (not shown). In some embodiments, the interposer 140 is mounted on the metal pillars 122 and the micro-bumps 162 by a surface mount technique. In some embodiments, the interposer 140 is a doped or undoped silicon substrate or an active layer of a silicon-on-insulator (SOI) substrate. In some embodiments, the interposer 140 is an organic interposer. In other embodiments, the interposer 140 is alternatively a glass substrate, a ceramic substrate, a polymer substrate, or any other substrate that provides a suitable protection and/or interconnection functionality. These and any other suitable materials are alternatively used for the interposer 140. In additional embodiments, the interposer 140 is a semiconductor package, a heat sink, or any combination thereof, instead of a semiconductor device.

In various embodiments, an organic interposer includes polymer matrix layers embedding redistribution interconnect structures (not shown), package-side bump structures (not shown), die-side bump structures (not shown) and are connected to a distal subset of the redistribution interconnect structures through a respective bump connection via structure (not shown). In various embodiments, at least one metallic shield structure laterally surrounds a respective one of the die-side bump structures. In some embodiments, shield support via structures laterally surround a respective one of the bump connection via structures. In various embodiments, the metallic shield structure and the shield support via structures are used to reduce mechanical stress applied to the redistribution interconnect structures, such as the RDL 110, during subsequent attachment of a semiconductor die to the die-side bump structures.

The interposer substrate 140 is formed, in some embodiments, from an organic material such as an epoxy impregnated glass-fiber laminate, polymer impregnated glass-fiber laminate, pre-impregnated composite fiber, Ajinomoto build-up film (ABF), molding compound, epoxy, PBO, polyimide or another organic material.

Figure 8:
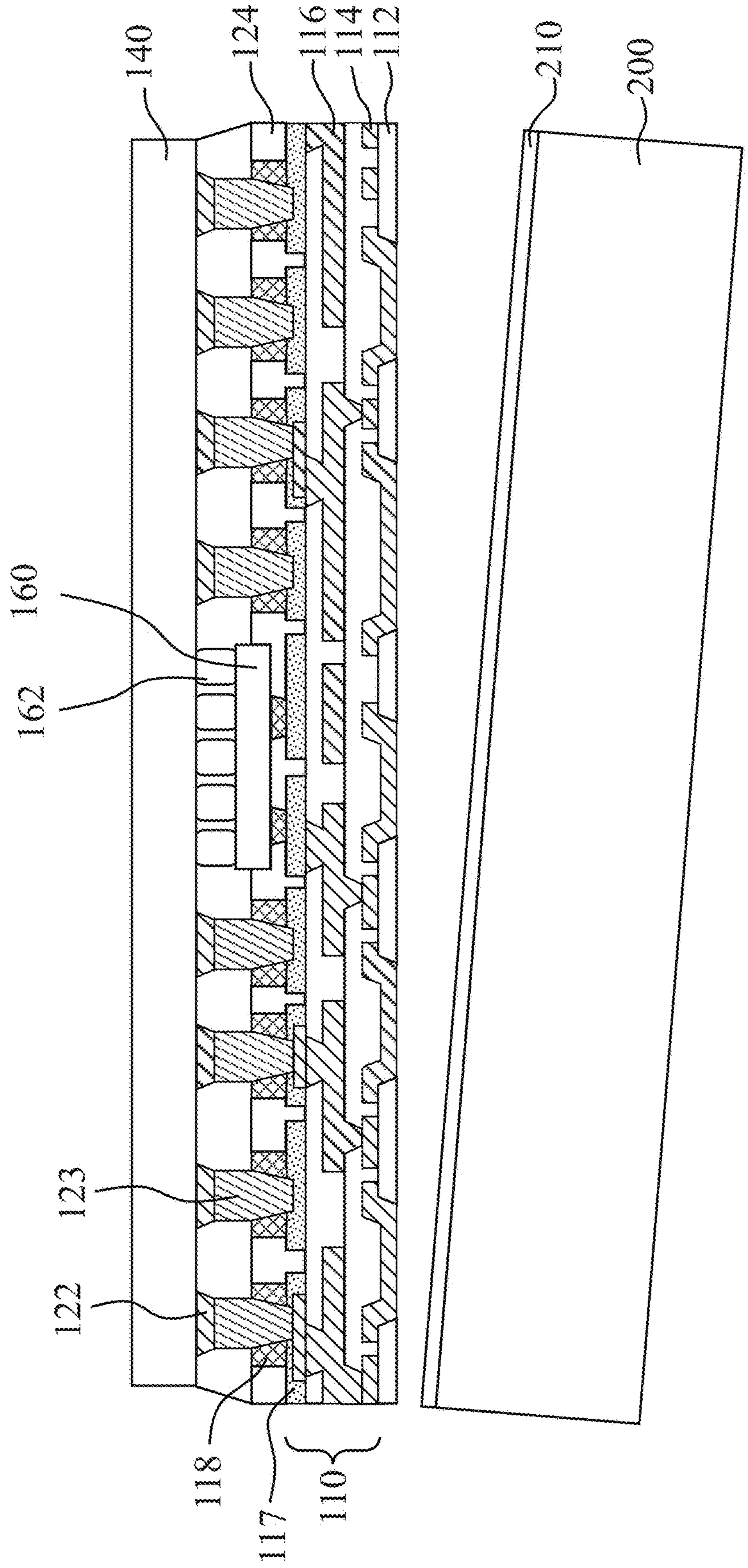
FIG. 8 shows, in cross-section, one of the stages of a sequential process for manufacturing a semiconductor device according to an embodiment of the present disclosure.

With reference now to FIG. 8, in various embodiments, the wafer 200 is next removed (e.g. de-bonded) using a thermal process to alter the adhesive properties of the adhesive layer 210 (if any). In an embodiment, an energy source such as an ultraviolet (UV) laser, a carbon dioxide ($CO_2$) laser, or an infrared (IR) laser, is utilized to irradiate and heat the adhesive layer 210 until the adhesive layer 210 loses at least some of its adhesive properties. Once performed, the wafer 200 and the adhesive layer 210 are physically separated and removed from the redistribution structure 110 of the reconstructed wafer. Other useful methods of removing the wafer 200 are contemplated.

For example, additional removal processes are performed to remove the wafer 200 to expose the top surface of the interconnection structure 110. These include an etching process, a planarization process (such as grinding or chemical mechanical polishing), or combinations thereof. In some embodiments, the wafer 200 is completely removed by the removal process. After the removal process is performed, the bottom surface of the RDL 110 and the conductive features of the metallization structure (e.g., the metal layer 114) are exposed, and are substantially coplanar with each other in some embodiments.

In various embodiments, after the wafer 200 is (partially or fully) removed, a lower surface of the metal layer 114 is revealed for sequential electrical connection. In some embodiments, the lower surface of the metal layer 114 is substantially coplanar with a lower surface of the dielectric layer 112. In some embodiments, the lower surface of the metal layer 114 is the lower surface of the pad portion 114-1.

Figure 9:
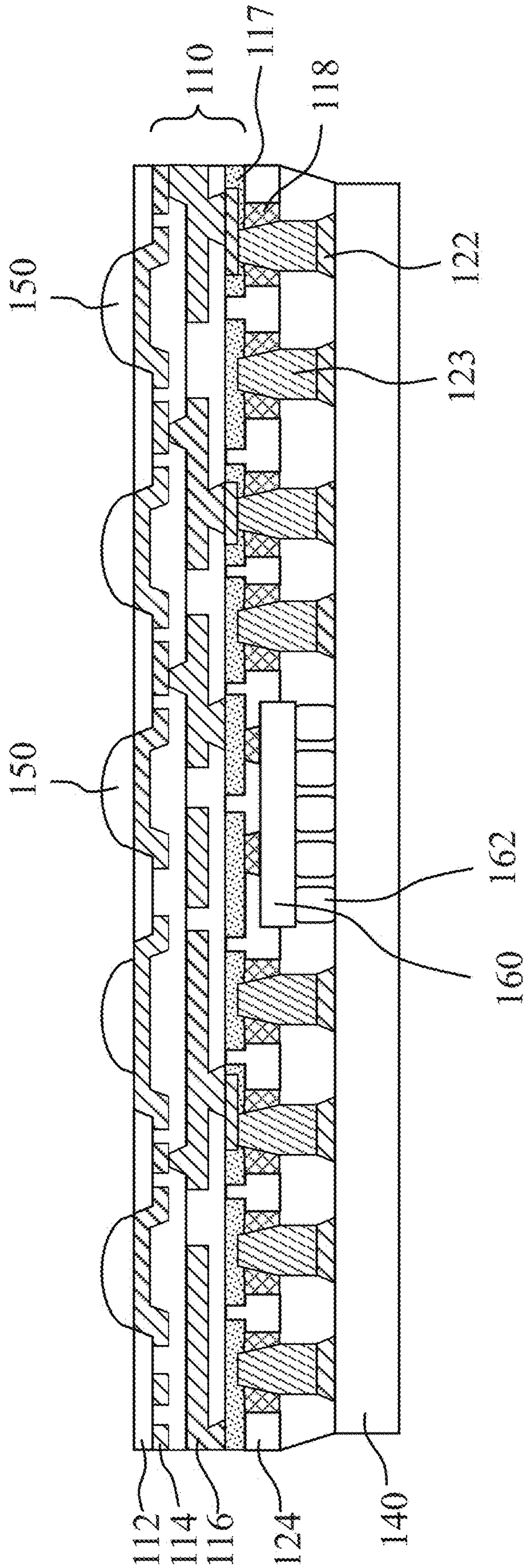
FIG. 9 shows, in cross-section, one of the stages of a sequential process for manufacturing a semiconductor device according to an embodiment of the present disclosure.

In various embodiments, the resultant structure, after the wafer 200 is removed, is flipped over as shown in FIG. 9. Then, at least one additional electrical component, e.g., a plurality of electrical connectors 150, are mounted on the lower surface of the pad portion 114-1, which are now described as face-up in FIG. 9. In some embodiments, the electrical connectors 150 includes a solder bump. In some embodiments, the electrical connectors 150 form a ball grid array (BGA). In some embodiments, the electrical connectors 150 can further include metal pillars as previously described. In various embodiments, the redistribution structure 110 includes a plurality of metal layers 114. Some of the pad portions 114-1 of the metal layers 114 are mounted with the electrical connector 150, and at least one of the pad portions 114-1 of the metal layers 114 are mounted with the integrated device 160. With such an arrangement, the pad portions 114-1 function as an under bump metallurgy (UBM) layer, so that an additional UBM layer is omitted. In some embodiments, the formation of the electrical connectors 150 includes placing solder balls on the pad portions 114-1, and then reflowing the solder balls. In alternative embodiments, the formation of the electrical connectors 150 includes performing a plating process to form solder materials on the pad portions 114-1, and then reflowing the plated solder materials. In some embodiments, the electrical connectors 150 are contact bumps and include a conductive material such as tin, or other suitable materials, such as silver or copper. In some embodiments in which the electrical connectors 150 are tin solder bumps, the electrical connectors 150 are formed by initially forming a layer of tin through any suitable method such as evaporation, electroplating, printing, solder transfer, ball placement, and the like. Once a layer of tin has been formed on the structure, a reflow is performed, in order to shape the material into the desired bump shape, in various embodiments. In some embodiments, the electrical connectors 150 are metal pillars, and the formation of the metal pillars includes photolithography and plating.

In some embodiments, the electrical connectors 150 are formed by initially forming a layer of under bump metallization in contact with a conductive portion of the RDL 110 and then placing a conductive feature and solder onto the under bump metallization. In some embodiments, a reflow operation is then performed, in order to shape the solder into the desired shape. In some embodiments, the solder is then placed into physical contact with the RDL 110 or other external device or carrier, and another reflow operation is performed to bond the solder therewith.

Throughout the description, the resultant structure including the redistribution structure 110, the interposer 140, the electrical connectors 150 and the integrated device 160 as shown in FIG. 9 is referred to as the semiconductor package. In some embodiments, the structure shown in FIG. 9 is also referred to as a chip-on wafer (CoW) structure.

Figure 10:
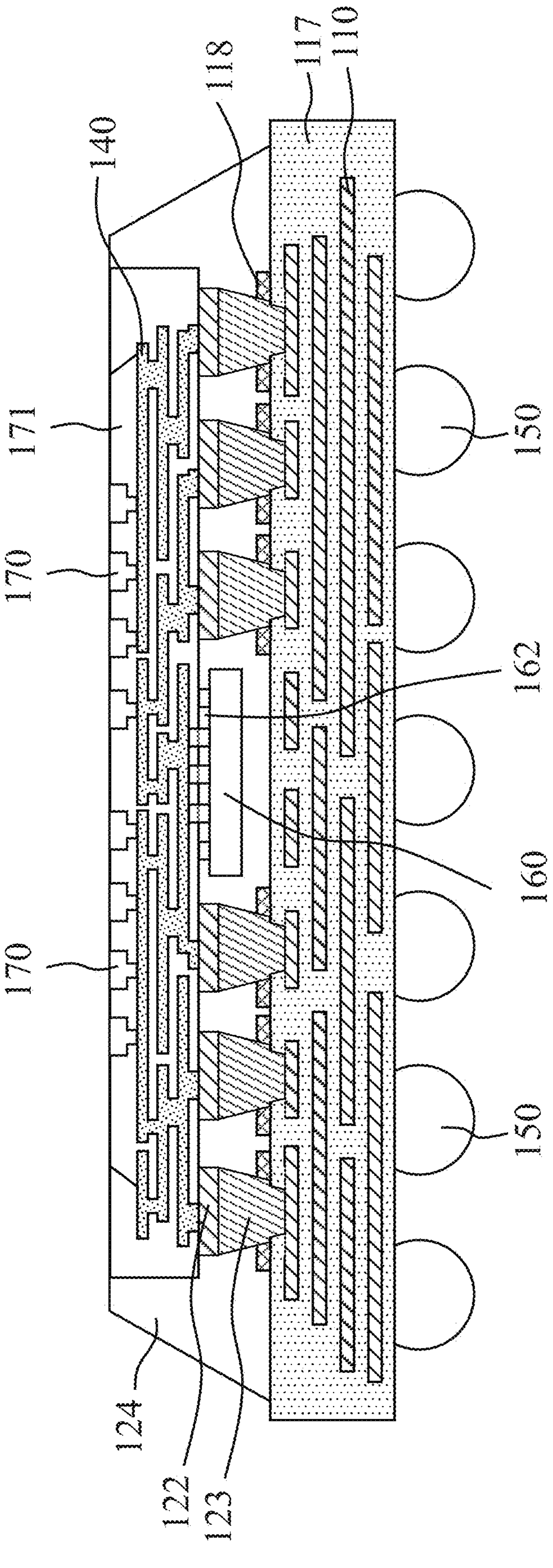
FIG. 10 shows, in cross-section, an embodiment of a semiconductor device manufactured according to an embodiment of the present disclosure.

With reference now to FIG. 10, in various embodiments, the CoW structure shown in FIG. 9 is flipped upside down, and micro-bumps 170 are formed in electrical connection with desired positions on the exposed top surface of the interposer 140. In various embodiments, a micro-bump underfill 171 is formed around the micro-bumps 170 between the interposer 140 and subsequently added components.

Figure 11:
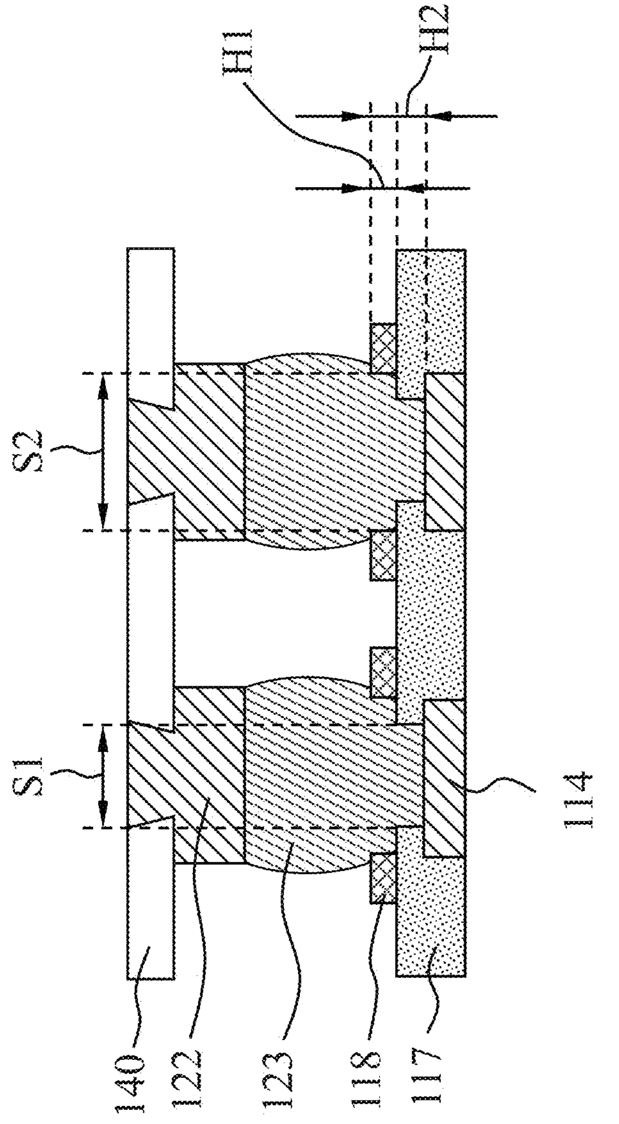
FIG. 11 shows, in cross-section, an embodiment of a portion of a semiconductor device manufactured according to an embodiment of the present disclosure.

FIG. 11 shows a cross-section of a portion of a semiconductor device manufactured according to some embodiments, and in particular shows the relation between the metal layers 114, protective layer 117, raised support structures 118, conductive bumps 123, metal pillars 122, and the interposer 140. Also depicted are the height (H1) of the protective layer 117, the height (H2) of the raised support structures 118, width (S1) of openings in the protective layer 117, and width (S2) of the empty internal portion of the raised support structures 118. In various embodiments, S1 and S2 substantially overlap to allow the formed conductive bumps 123 to make contact with the exposed metal layer 114 of the RDL 110.

In some embodiments, the heights H1 and H2 are between about 15 μm and about 45 μm. In some embodiments, H1 is set to be less than or equal to H2. In some embodiments, the ratio of H1:H2 is between about 0.33 and about 1, such as between about 0.4 and about 0.9, or between about 0.5 and about 0.75.

In some embodiments, S1 is between about 50 μm and about 120 μm. In some embodiments, S2 is between about 55 μm and 140 μm. In some embodiments, S1 is less than S2. In some embodiments, the ratio of S1:S2 is between about 0.35 and about 0.9, such as between about 0.4 and about 0.8, or between about 0.5 and about 0.75. In some embodiments, S2 is larger than S1 so that the raised support structures 118 provide improved circumferential support to and help raise the height of the conductive bumps 123. In some embodiments, the conductive bumps 123 are entirely within the empty internal portion of the raised support structures 118. In some embodiments, the conductive bumps 123 are disposed at least partially on a top surface of the wall portion of the raised support structures 118.

Figure 12:
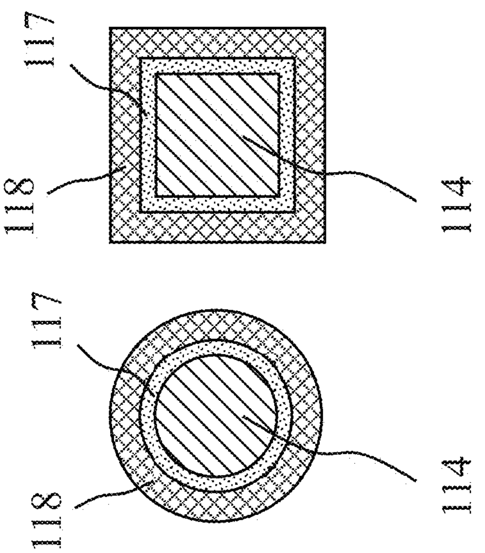
FIG. 12 illustrates a top view of a portion of an embodiment of a semiconductor device manufactured according to an embodiment of the present disclosure.

FIG. 12 illustrates a top-down view of various raised structures 118 of a semiconductor device manufactured according to some embodiments of the present disclosure. The raised structures 118 are round or square as shown. In some embodiments, there are multiple raised structures 118 formed on the wafer 200. In some embodiments, the raised structures 118 are all the same shape on the wafer 200. In some embodiments, the raised structures 118 formed on the wafer 200 include two or more shapes disposed in a pattern. It has been found that substantially round or near-round shapes of the raised support structures 118 provide reliable support to the conductive bumps 123. Looking down through the central opening within the raised support structure 118, portions of the underlying protective layer 117 and exposed metal layer 114 are shown.

Figure 13:
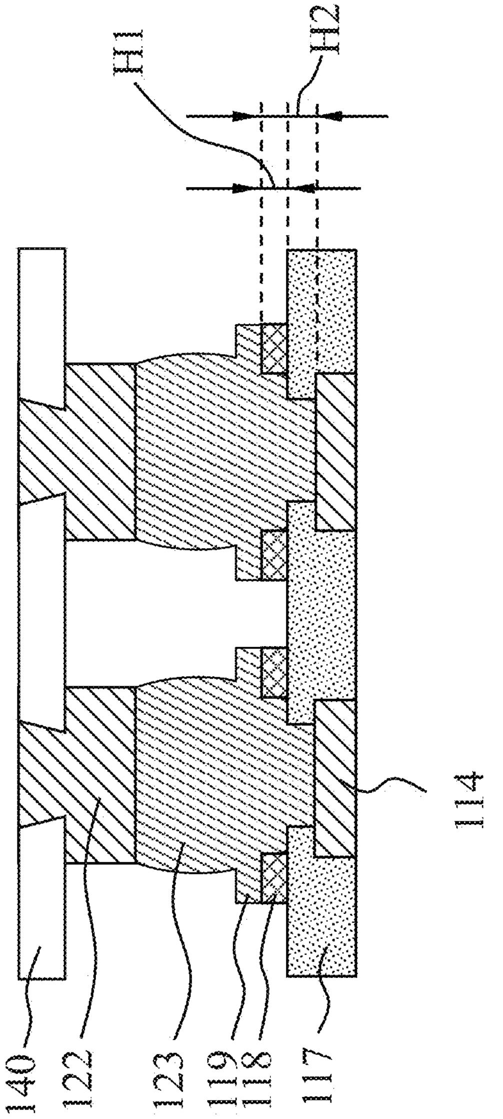
FIG. 13 shows, in cross-section, an embodiment of a portion of a semiconductor device manufactured according to an embodiment of the present disclosure.

FIG. 13 shows a cross-section of a portion of a semiconductor device manufactured according to some embodiments, and in particular shows the relation between the metal layers 114, protective layer 117, raised support structures 118, conductive bumps 123 and metal pillars 122. In these embodiments, the raised support structures 118 include a second wall layer 119. In some embodiments more than one additional wall layer is provided. In some embodiments, the second wall layer 119 is concentrically disposed around an exterior of the initial wall of the raised support structure 118. In some embodiments, the second wall layer 119 is stacked on top of the initial wall layer of the raised support structure 118, in order to provide increased support and elevation to the later-deposited conductive bumps 123. In some embodiments, the second wall layer 119 is made of a separate selected material than the available material actually used for the initial raised support structure 118.

Figure 14:
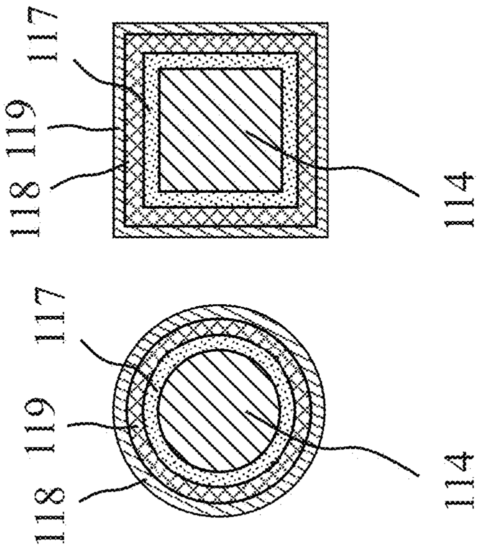
FIG. 14 illustrates a top view of a portion of an embodiment of a semiconductor device manufactured according to an embodiment of the present disclosure.

FIG. 14 illustrates a top view of certain embodiments of the second wall layer 119 of the raised support structure 118 in relation to the protective layer 117 and the exposed metal layer 114. Other configurations are likewise contemplated.

In various embodiments, the conductive bumps 123 are formed after an "on System" manufacturing process. In embodiments where the integrated device 160 is an IPD (such as an LSI or bridge) in an HPC application, the bump height of the conductive bump 123 and the metal pillar 122 sometimes fail to extend to the height of IPD. In such circumstances, this can induce IPD die damage or cold joint risk that detrimentally affects batch package reliability. In various embodiments, the substrate thickness of the wafer 200 imposes a limit on raw ball size that determines bump height. Accordingly, in place of solely providing a bare protective layer 117 under the conductive bumps 123, the raised structures 118 surrounds the conductive bumps 123 for enlarging joint height and providing lateral support.

Figure 15:
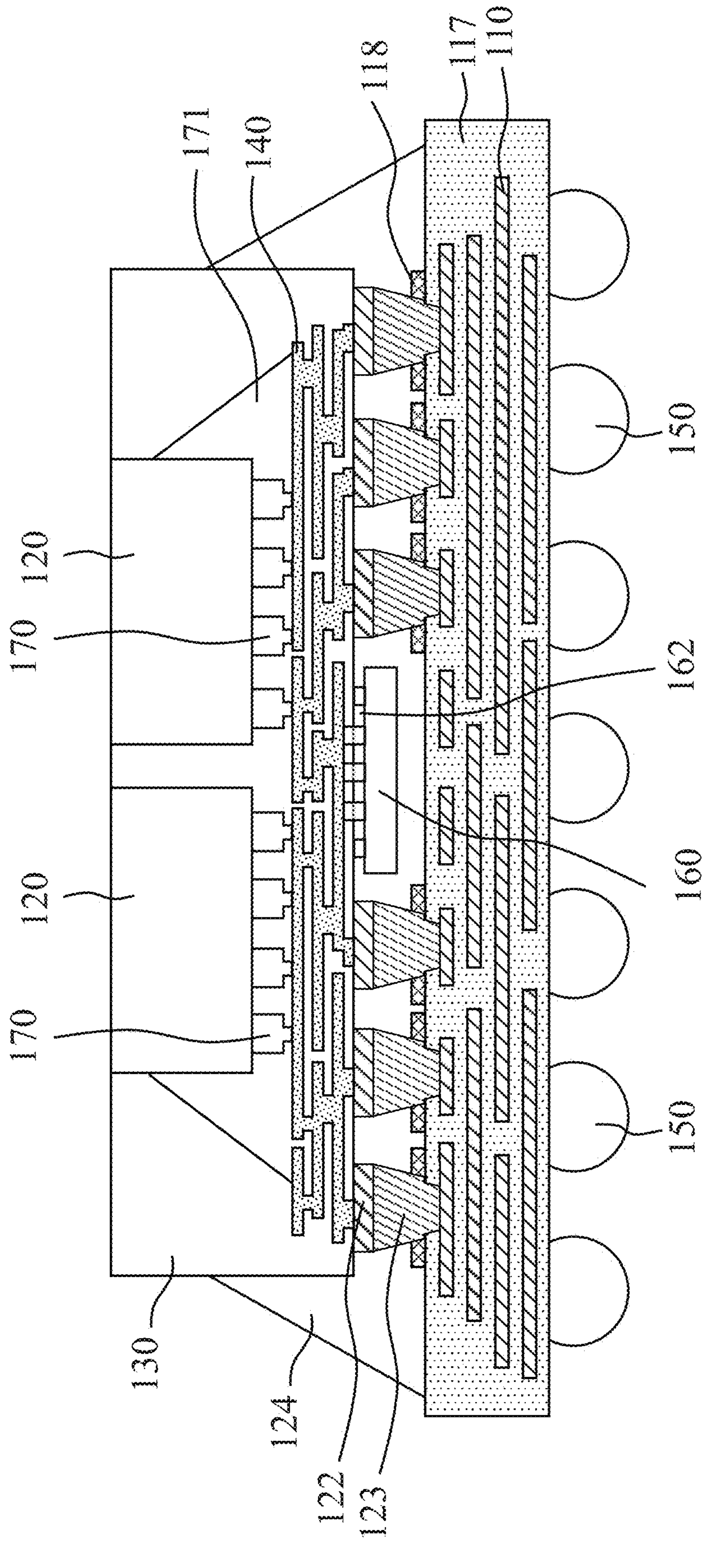
FIG. 15 shows, in cross-section, an embodiment of a semiconductor device manufactured according to an embodiment of the present disclosure.

FIG. 15 shows an embodiment of a completed semiconductor device 100 manufactured according to an embodiment of the present disclosure. In some embodiments, one or more semiconductor chips 120, such as a System on Chip (SoC), a Dynamic Random Access Memory (DRAM) or other High Bandwidth Memory (HBM) is placed in electrical communication with the micro-bumps 170 over the interposer 140 and, in some embodiments, an encapsulant layer 130 (made of a molding compound or the like) is formed thereover in order to form a completed semiconductor package 100.

In some embodiments, at least one chip 120 is illustrated, but this disclosure is not limited thereto. In other embodiments, the semiconductor package 100 includes more than one chip 120 as a set, and the through vias surround the set of chips 120. In an embodiment, the chips 120 are mounted, for example, by a surface mount technique through a plurality of electrical terminals, such as conductive bumps 123, although any suitable method of mounting is alternatively utilized.

In some embodiments, the chips 120 are logic device dies including logic circuits therein. In some exemplary embodiments, the chips 120 are dies that are designed for mobile applications, including a Power Management Integrated Circuit (PMIC) die and a transceiver (TRX) die. In some embodiments, the chips 120 are the same types of dies or are different types of dies. For example, the chips 120 are an application-specific integrated circuit (ASIC) chip, a system on chip (SoC), an analog chip, a sensor chip, a wireless and radio frequency chip, a voltage regulator chip, a memory chip or the like in various embodiments.

In some exemplary embodiments, each of the chips 120 include a substrate (not shown), a plurality of active devices (not shown), and a plurality of contact pads (not shown). The contact pads (such as copper pads) are formed on an active surface (e.g., a lower surface) of the chips 120 and electrically coupled to the micro-bumps 170 in some embodiments.

In various embodiments, the chips 120 and the through vias (if any) are encapsulated by the encapsulating material 130. In other words, the encapsulating material 130 is formed to encapsulate the chips 120 and the through vias (if any). In various embodiments, the encapsulating material 130 encapsulates the chips 120 and any conductive joints. In some embodiments, the encapsulant 130 fills the gap between the chips 120 and the micro-bumps 170. In some embodiments, the encapsulating material 130 is in contact with the redistribution structure 110. The encapsulating material 130 includes a molding compound resin such as polyimide, polyphenylene sulfide (PPS), polyether ether ketone (PEEK), polyethersulfone (PES), a heat resistant crystal resin, combinations of these, or the like in various embodiments. The encapsulation of the chips 120 and the through vias (if any) is performed in a molding device (not shown) in various embodiments. In some embodiments, the encapsulating material 130 is placed within a molding cavity of the molding device, or else are injected into the molding cavity through an injection port.

In some embodiments, the chips 120 are connected to other devices external to the semiconductor device 100 through a type of packaging utilizing solder bumps. In such a fashion, a physical and electrical connection is made between the chips 120 and an external device, such as a printed circuit board, another semiconductor die, or the like.

In some embodiments, the chips 120 are electrically bonded to the wafer 108 through a plurality of micro-bumps 170. In some embodiments, the mounting of the chips 120 include pick-and-place processes.

In some embodiments, the encapsulant 130 is formed by an over-molding process. Thereafter, a planarization process such as a chemical mechanical polishing (CMP) process is performed. In some embodiments, once the encapsulating material 130 has been placed into the molding cavity such that the encapsulating material 130 encapsulates the chips 120 and the through vias (if any), the encapsulating material 130 is cured, in order to harden the encapsulating material 130 for optimum protection. Additionally, initiators and/or catalysts are included within the encapsulating material 130 to better control the curing process in various embodiments.

In some embodiments, a thinning process is performed on the encapsulating material 130 to reveal or thin one or more surfaces thereof in accordance with design requirements. In various embodiments, the thinning process is, for example, a mechanical grinding or CMP process whereby chemical etchants and abrasives are utilized to react and grind away the encapsulating material 130. After the thinning process is performed, the back surface of the chips 120 is substantially level with the upper surface of the encapsulating material 130 in some embodiments. However, while the CMP process described above is presented as one illustrative embodiment, it is not intended to be limiting. Any other suitable removal process is alternatively used to thin the encapsulating material 130. For example, a series of chemical etches are useful. This process and any other suitable process are alternatively utilized to thin the encapsulating material 130, and all such processes are fully intended to be included within the scope of the embodiments.

In some embodiments, a package structure 100 is thus formed, which in some embodiments is also referred to as a CoWoS package. With such an arrangement, a plurality of semiconductor packages 100 are formed concurrently for batch production in some embodiments.

In various embodiments, thereafter, a singulation process is performed to form a plurality of singulated package structures 100. In some embodiments, the semiconductor package 100 is in a wafer form in the process. Accordingly, in various embodiments, a singularizing process is performed on the semiconductor package 100 to form a plurality of semiconductor packages 100. In an embodiment, the singularizing process is performed by using a saw blade (not shown) to slice through the semiconductor package in wafer form, thereby separating one section (e.g. include one chip 120 and one interposer 140) from another to form the semiconductor package 100. However, as one of ordinary skill in the art will recognize, utilizing a saw blade to singulate the semiconductor packages 100 is merely one illustrative embodiment and is not intended to be limiting. Alternative methods for singulating the semiconductor packages 100, such as utilizing one or more etches to separate the semiconductor packages 100, are alternatively utilized. These methods and any other suitable methods alternatively utilized to singulate the semiconductor packages 100. In various embodiments, the semiconductor package 100 is an integrated fan-out (InFO) package.

Figure 16:
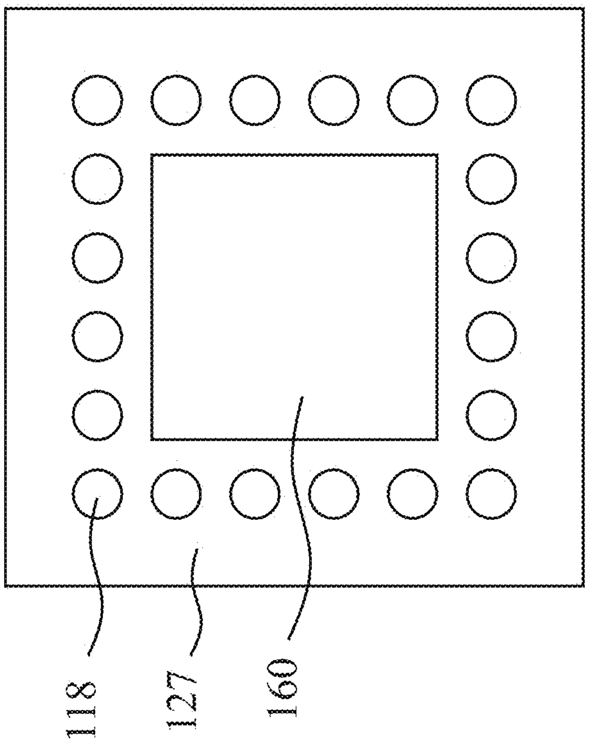
FIG. 16 illustrates a top view of a pad pattern of a semiconductor package according to an embodiment of the present disclosure.

FIG. 16 illustrates a top view of some embodiments of a pad pattern of a semiconductor package according to various embodiments. In some embodiments, the raised structures 118 are disposed in a pattern that surrounds the integrated device 160.

Figure 17:
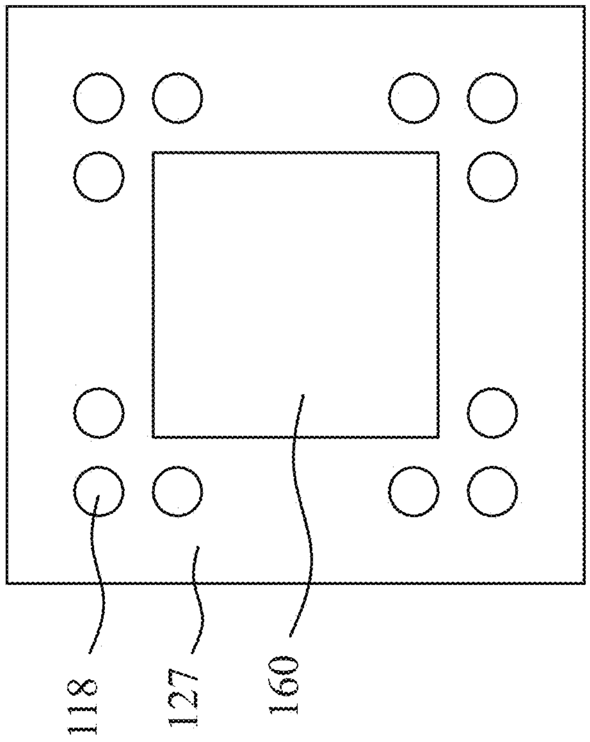
FIG. 17 illustrates a top view of a pad pattern of a semiconductor package according to an embodiment of the present disclosure.

FIG. 17 illustrates a top view of a pad pattern of a semiconductor package according to various embodiments. In some embodiments, the raised structures 118 are disposed in a pattern that surrounds the corner portions of the integrated device 160. Other patterns of raised structures are likewise contemplated.

Figure 18:
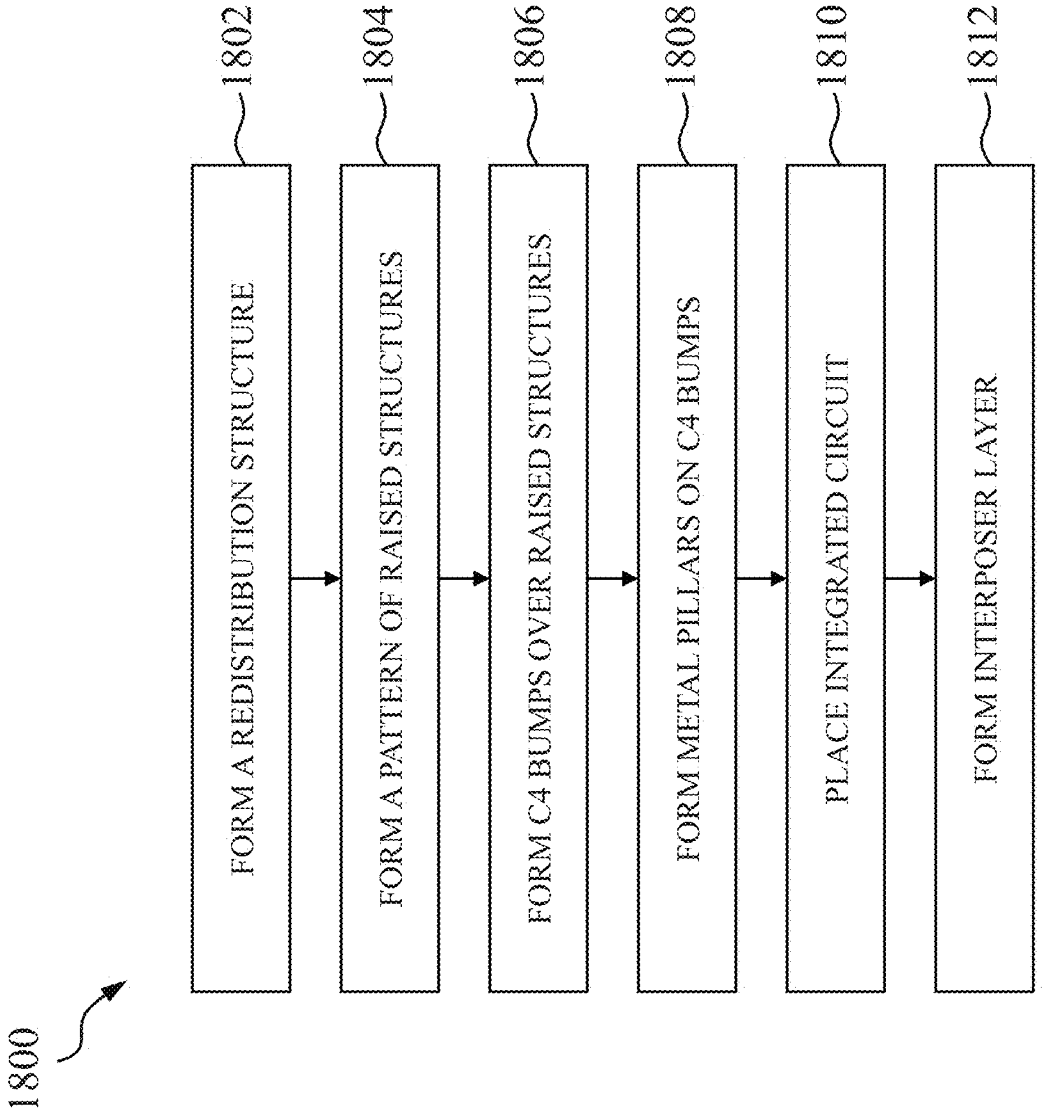
FIG. 18 shows an exemplary manufacturing process according to an embodiment of the present disclosure.

FIG. 18 shows an exemplary manufacturing process 1800 according to various embodiments of the present disclosure. In some embodiments, the process 1800 commences by forming a redistribution structure such as an RDL 110 (operation 1802). Next, at operation 1804, a pattern of raised structures, such as raised support structure 118, are formed over the RDL 110. Next, at operation 1806, conductive bumps 123 are formed and deposited within the raised structures 118, which provide support and elevation thereto.

Next, at operation 1808, metal pillars 122 are formed over the conductive bumps 122. Next, at operation 1810, an integrated device 160 is positioned within the pattern of raised structures 118 and micro-bumps 162 are formed on the top surface of the integrated device 160 for providing electrical communication therewith. In some embodiments, the integrated device 160 is at least partially disposed within the underfill 124. Then, at operation 182, an interposer 140 is disposed over the metal pillars 122 and the micro-bumps 162 of the integrated device 160.

The various embodiments or examples described herein offer several advantages over the existing art. In the embodiments of the present disclosure, the raised structures 118 provide structural support to the conductive bumps 122 to enlarge bump height, which in turn, improves electrical connections of various components and device reliability. It will be understood that not all advantages have been necessarily discussed herein, no particular advantage is required for all embodiments or examples, and other embodiments or examples may offer different advantages.

In accordance with one aspect of the present disclosure, a method of manufacturing a package structure includes providing an interconnection structure having one or more alternating conductive layers and dielectric layers. In some embodiments, a portion of a conductive layer is exposed through a surface of the interconnection structure. In some embodiments, a raised structure is formed around the portion of the conductive layer. In some embodiments, a conductive bump is formed within the raised structure and is in contact with the conductive layer. In such embodiments, the raised structure provides support to and elevates the conductive bump. In some embodiments, a metal pillar if formed over the conductive bump that provides electrical connection to the conductive layer.

In additional embodiments, an interposer is provided, which has a bottom surface in contact with a top surface of the metal pillar. In some embodiments, a plurality of micro-bumps are formed on a top surface of the interposer. In some embodiments, each of the micro-bumps are in electrical communication with an electrical contact of the interposer. In some embodiments, a micro-bump underfill is formed on the plurality of micro-bumps. In some embodiments, a semiconductor chip is placed in electrical contact with the plurality of micro-bumps. In some embodiments, an encapsulant layer is formed that encapsulates the top surface of the interposer, the plurality of micro-bumps and at least a portion of the semiconductor chip, thereby forming a Chip on Wafer on Substrate (CoWoS) semiconductor device. In some embodiments, an underfill layer is formed above the redistribution structure around the conductive bump prior to the forming of the interposer and a passive semiconductor device die or the like is placed within an opening in the underfill layer. In some embodiments, a plurality of micro-bumps are formed on a top surface of the semiconductor device that make electrical contact with the interposer. In some embodiments, the raised structures are at least one of a round structure and a polygon structure.

In accordance with another aspect of the present disclosure, a semiconductor device includes a redistribution layer (RDL) having an exposed internal metal layer. In some embodiments, the semiconductor device further includes a protective layer disposed over the RDL and made from a first material. In some embodiments, a raised wall is formed of a second material that differs from the first material and is disposed on the protective layer and around the exposed internal metal layer. In some embodiments, a conductive bump is at least partially disposed within the raised wall over the RDL and in contact with the exposed internal metal layer. In some embodiments, a metal pillar is disposed on the bump forming a metal contact that provides electrical communication with the exposed internal metal layer.

In various embodiments, the semiconductor device includes an interposer in electrical contact with the metal pillar. In some embodiments, a passive device is disposed above the RDL and in electrical communication with the interposer via at least one micro-bump. In some embodiments, a plurality of conductive bumps is disposed around the passive device in a rectangular pattern. In some embodiments, a plurality of conductive bumps are disposed around at least one corner of the passive device.

In accordance with another aspect of the present disclosure, a semiconductor device includes a layer having an exposed metal layer. In some embodiments, a protective layer is disposed over the layer and is formed from a first material. In some embodiments, a wall structure is disposed over the protective layer and around the exposed metal layer, and the wall structure is made of a second material that is different from the first material. In some embodiments, a conductive bump is at least partially disposed within the wall structure and in contact with the exposed metal layer. In some embodiments, the wall structure is shaped like a regular polygon, such as a triangle, a square, a rectangle, a pentagon, a hexagon and an octagon. In some embodiments, the wall structure has a round shape, such as a circle or an ellipse. In some embodiments, the wall structure comprises at least two conjoined and concentric wall structures.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a package structure, comprising:

forming an interconnection structure having a plurality of alternating conductive layers and dielectric layers;

exposing a portion of a conductive layer through a surface of the interconnection structure;

forming a protective layer over the interconnection structure, the protective layer defining an opening exposing the portion of the conductive layer through the surface of the interconnection structure;

forming a raised structure over the protective layer and around the portion of the conductive layer;

forming a conductive bump within the raised structure and in direct contact with the conductive layer through the opening in the protective layer, wherein the raised structure provides support to and elevates the conductive bump; and forming a metal pillar over the conductive bump that provides electrical connection to the conductive layer, wherein the raised structure remains in the package structure.

2. The method of claim 1, further comprising:

mounting an interposer having a bottom surface in contact with a top surface of the metal pillar.

3. The method of claim 2, further comprising:

forming a plurality of micro-bumps on a top surface of the interposer, each of the micro-bumps in electrical communication with an electrical contact of the interposer.

4. The method of claim 3, further comprising:

forming a micro-bump underfill on the plurality of micro-bumps.

5. The method of claim 3, further comprising:

placing a semiconductor chip in electrical contact with the plurality of micro-bumps.

6. The method of claim 5, further comprising:

forming an encapsulant layer that encapsulates the top surface of the interposer, the plurality of micro-bumps and at least a portion of the semiconductor chip, thereby forming a packaged semiconductor device.

7. The method of claim 2, further comprising:

forming an underfill layer above the interconnection structure around the conductive bump prior to the mounting of the interposer; and placing a passive semiconductor device die within an opening in the underfill layer.

8. The method of claim 7, further comprising:

forming a plurality of micro-bumps on a top surface of the passive semiconductor device die that make electrical contact with the interposer.

9. The method of claim 1, wherein the forming of the raised structure further comprises:

forming at least one of a round structure and a polygon structure.

10. A method of manufacturing a semiconductor device, comprising:

exposing a portion of an internal metal layer of a redistribution layer (RDL);

forming a protective layer over the RDL with the portion of the internal metal layer exposed through the protective layer, the protective layer comprising a first material;

forming a raised support structure on the protective layer and around the exposed internal metal layer, the raised support structure defining an empty internal portion with the internal metal layer exposed therein, and the raised support structure comprising a second material that differs from the first material;

forming a conductive bump at least partially within the empty internal portion defined by the raised support structure, over the RDL and in contact with the exposed internal metal layer; and forming a metal pillar on the conductive bump, the metal pillar forming a metal contact that provides electrical communication with the exposed internal metal layer, wherein the raised support structure provides support to and elevates the conductive bump and remains in the semiconductor device.

11. The method of claim 10, further comprising mounting an interposer in electrical contact with the metal pillar.

12. The method of claim 11, further comprising positioning a passive device above the RDL and in electrical communication with the interposer via at least one micro-bump.

13. The method of claim 12, wherein the passive device comprises a plurality of conductive bumps disposed around the passive device in a rectangular pattern, the method further comprising electrically connecting the plurality of conductive bumps to the interposer.

14. The method of claim 12, further comprising forming a plurality of conductive bumps disposed around at least one corner of the passive device.

15. A method of manufacturing a semiconductor device, comprising:

forming a first layer having an exposed metal layer;

forming a protective layer over the first layer, the protective layer having an opening exposing the exposed metal layer, the protective layer comprising a first material;

forming a wall structure with an empty internal portion over the protective layer and around the exposed metal layer, the exposed metal layer is within the empty internal portion of the wall structure, the wall structure comprising a second material different from the first material; and forming a conductive bump at least partially within the empty internal portion of the wall structure and in contact with the exposed metal layer, wherein the wall structure remains in the semiconductor device.

16. The method of claim 15, wherein forming the wall structure comprises forming a regular polygon.

17. The method of claim 16, wherein the regular polygon comprises at least one of: a triangle, a square, a rectangle, a pentagon, a hexagon, and an octagon.

18. The method of claim 15, wherein forming the wall structure comprises forming at least two conjoined and concentric wall structures.

19. The method of claim 15, wherein forming the wall structure comprises forming a round shape.

20. The method of claim 19, wherein the round shape comprises at least one of a circle and an ellipse.

* * * * *